United States Patent [19]

Mycek et al.

[11] Patent Number: 5,714,079
[45] Date of Patent: Feb. 3, 1998

[54] METHOD FOR MAKING A THIN GAUGE METALLIC ARTICLE WITH ELECTRICAL INSULATION ON ONE SIDE

[75] Inventors: Edwin Anthony Mycek, Scottsville; Larry Lee Lapa, Rochester, both of N.Y.

[73] Assignee: Eastman Kodak Company, Rochester, N.Y.

[21] Appl. No.: 569,340

[22] Filed: Dec. 8, 1995

[51] Int. Cl.⁶ .................................................. G03C 5/00
[52] U.S. Cl. ........................ 216/35; 216/36; 216/43; 216/49; 156/298; 156/272.2
[58] Field of Search .......................... 216/34, 35, 36, 216/43, 48, 49; 156/298, 272.2

[56] References Cited

U.S. PATENT DOCUMENTS

| | | | |
|---|---|---|---|
| 3,620,736 | 11/1971 | Tarkington | 96/36 |
| 3,719,536 | 3/1973 | Rheingold et al. | 156/6 |
| 3,850,519 | 11/1974 | Weikel, Jr. | 355/3 R |
| 3,977,873 | 8/1976 | Keil | 96/27 R |
| 4,045,863 | 9/1977 | Mitterhummer et al. | 29/588 |
| 4,217,168 | 8/1980 | Ridgway et al. | 430/320 |
| 4,724,465 | 2/1988 | Davies | 355/53 |
| 4,891,680 | 1/1990 | Gross et al. | 355/309 |
| 4,933,723 | 6/1990 | Kakuta et al. | 355/271 |
| 4,947,214 | 8/1990 | Baxendell et al. | 355/274 |
| 5,391,458 | 2/1995 | Conrad | 430/258 |
| 5,413,838 | 5/1995 | Azuma et al. | 428/194 |

OTHER PUBLICATIONS

"Economical Production of Small, thin Gauge Precision Parts", *Photofabrication*, Kodak Mechanical products and Services, 1994.

DuPont Technical Information Bulletin, "Phototool Requirements for Use with VACREL® Dry Film Solder Mask", Apr. 1985, pp. 16–18.

Technical Information, "Aqua Mer® MP 200 Series Dry Film Photoresist", Hercules Inc., Jul. 17, 1992, pp. 1, 2, 5 & 6, Document No. SGS102-1.

*Primary Examiner*—R. Bruce Breneman
*Assistant Examiner*—Michael E. Adjodha
*Attorney, Agent, or Firm*—Arthur H. Rosenstein

[57] ABSTRACT

A metallic sheet (10) is laminated between a pair of photoresist layers (26, 30) having different properties which permit one photoresist (26) to be stripped from the metallic sheet, substantially without effecting the other photoresist (30). A thin gauge blank or article (56) is photo-chemically machined from the lamination and the photoresist (26) is stripped from one side, leaving the other photoresist (30) to provide electrical insulation on just one side of the article.

12 Claims, 1 Drawing Sheet

METHOD FOR MAKING A THIN GAUGE METALLIC ARTICLE WITH ELECTRICAL INSULATION ON ONE SIDE

DESCRIPTION

1. Technical Field

The invention concerns methods for making thin gauge metallic articles. More particularly, the invention is related to methods for photochemically machining such articles, while providing a layer of electrical insulation on one side.

2. Background Art

In various industrial and commercial applications, thin gauge articles or parts are required which include electrically insulating coatings or layers on their exterior surfaces. For example, U.S. Pat. No. 3,850,519 discloses a xerographic copier in which a corona baffle is made from a metal core coated with a thin layer of dielectric material. U.S. Pat. No. 4,045,863 discloses a method for making carriers for integrated circuit chips, in which the carriers are coated on opposite sides with electrically insulating materials. U.S. Pat. No. 4,217,168 discloses a method for making laminations for a magnetic core in which photoresist techniques are used to define the part geometry and portions of the photoresist on each side of each lamination are used as bonding agents when the core is laminated.

While such prior art methods are useful for producing parts with electrical insulation on essentially all surfaces, there are applications in which a thin gauge part is desired which has insulation on only one or selected surfaces. For example, in xerographic copiers, a receiver copy sheet may be urged against a dielectric member by a flexible blade, such as shown in U.S. Pat. No. 4,947,214.

The previously mentioned prior art techniques for making thin gauge parts with insulating coatings are not suitable for parts with coatings on only one side, since the coating on one side cannot be removed without damaging the part, or the coating on the other side, or both. Thus, a need has existed for a method for making thin gauge metallic parts which are coated on one side with an electrically insulating material.

SUMMARY OF THE INVENTION

The objective of the invention is to provide a photochemical machining method for producing thin gauge metallic articles or parts with electrical insulation on only one side.

This objective is given only by way of illustrative example; thus other desirable objectives and advantages inherently achieved by the disclosed method may occur or become apparent to those skilled in the art. Nonetheless, the scope of the invention is to be limited only by the appended claims.

The method of our invention is particularly suited for making an electrically insulated article and may include steps of: providing a metallic sheet having a first side surface and a second side surface; cleaning the first and second side surfaces to remove foreign materials; applying a layer of a first photoresist material to the first side surface; and applying a layer of a second, different photoresist material to the second side surface. The method further may include steps of: exposing to radiation both of the layers of photoresist material via masks configured to define registered, substantially congruent outlines of the article in the two layers; and after the exposing, developing the photoresist materials by removing portions of the layers to define the congruent outlines of the article. Those skilled in the art will appreciate that the two masks need not be completely identical to practice the invention. Further steps may include: etching through the metallic sheet at the congruent outlines from one or both side surfaces to define and separate from the sheet a blank for the article; and chemically treating the blank for the article to remove the first photoresist material without substantially effecting the second photoresist material, thereby providing a finished blank with electrical insulation on only one side.

Our method further may include steps of: prior to applying the first photoresist material, treating the first side surface to adhere less aggressively to the first photoresist material; and prior to applying the second photoresist material, treating the second side surface to adhere more aggressively to the second photoresist material. The side may be provided with a fine surface finish and the second side may be provided with a more coarse surface finish.

The first and second photoresist materials may be applied by laminating sheets of dry film photoresist material to the first and second sides. Alternatively, the first and second photoresist materials may be applied by coating liquid photoresist material to the first and second sides. The chemically treating step may include steps of: placing the blank for the article in a pan with the first photoresist material facing upward; and soaking the blank in a chemical solution which causes the first photoresist material to release from the blank; and after the soaking, removing the first photoresist material.

An alternative embodiment of our method also may be used for making an electrically insulated article. The alternative may include steps of: providing a metallic sheet having a first side surface and a second side surface; cleaning the first and second side surfaces to remove foreign materials; applying a layer of a photoresist material to the first side surface; applying a layer of a second, different material to the second side surface. The method may further include steps of: exposing to radiation the layer of photoresist material via a mask configured to define an outline of the article; after the exposing, developing the photoresist material by removing portions of the layers to define the outline of the article; etching through from one side of the metallic sheet at the outline to define a blank for the article; and chemically treating the blank for the article to remove one of the first or second materials without substantially effecting the other material, thereby providing a finished blank with an electrically insulating layer on one side only.

The method of our invention provides various advantages. The method provides an article with burr free edges, without producing mechanical or thermal stresses in the metal. The coating of electrical insulation is provided on a single side of the article, without requiring use of potentially damaging mechanical processes to remove a coating from the other side. The coating of electrical insulation is flexible enough to permit the article to be bent or otherwise deformed for its ultimate application. No insulation is applied to the side edges of the article, leaving the edges clean for the end use. The method of producing the article is simple, using conventional equipment for photochemical machining.

BRIEF DESCRIPTION OF THE DRAWINGS

The foregoing and other objectives, features and advantages of the invention will be apparent from the following more particular description of the preferred embodiments of the invention, as illustrated in the accompanying drawings.

DESCRIPTION OF THE PREFERRED EMBODIMENTS

Figure 1:
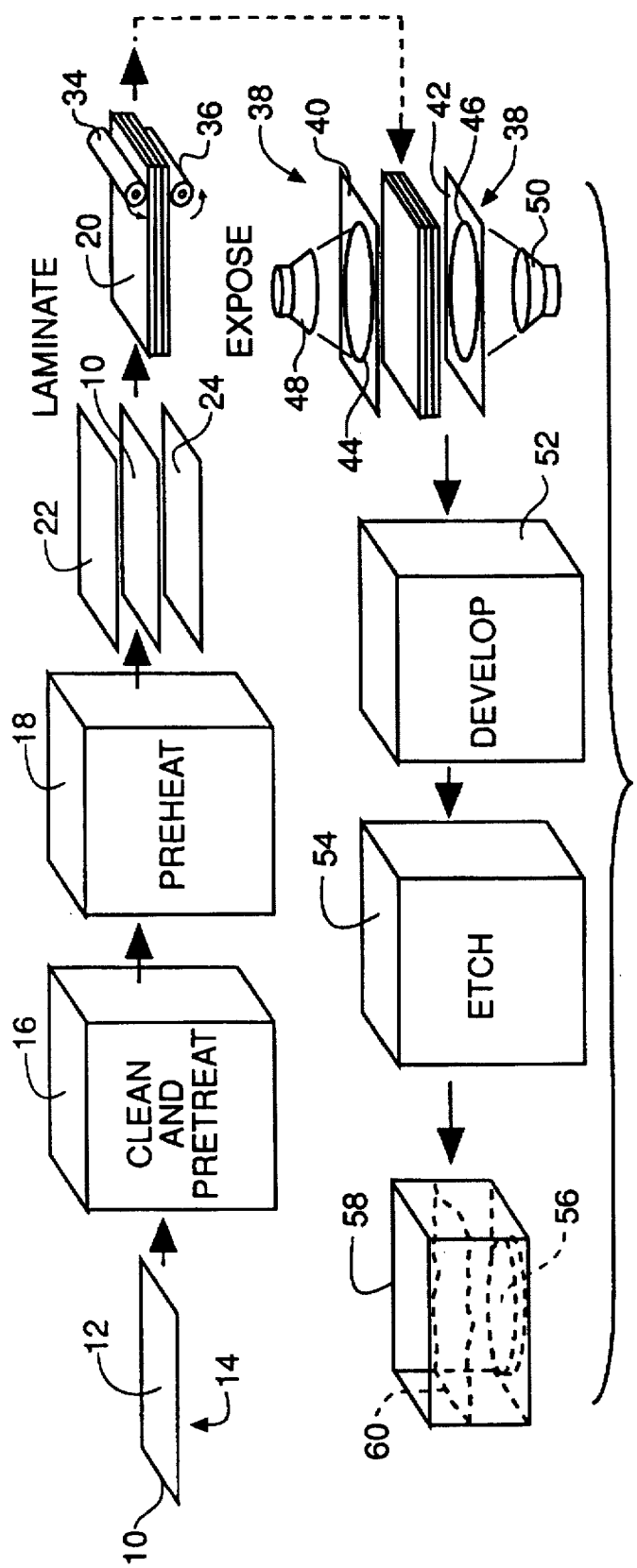
FIG. 1 shows a schematic flow diagram for the method of the invention.

The following is a detailed description of the preferred embodiment of the invention, reference being made to the drawings in which the same reference numerals identify the same elements of structure in each of the Figures.

Figure 2:
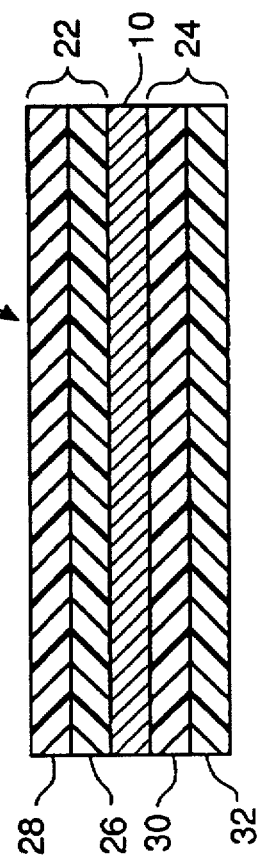
FIG. 2 shows a cross section through a lamination of metallic sheet and two different photoresist materials, prior to exposure to define the geometry of the part or article.

With reference to FIGS. 1 and 2, the method of the invention can be understood. A sheet 10 of electrically conductive material such as stainless steel, carbon steel, brass, or copper first is cleaned at a station 16 using conventional techniques to remove foreign materials from its first side surface 12 and second side surface 14. For example, suitable cleaning may be done by soaking the sheet in an alkali cleaner, such as sodium or potassium hydroxide solution, at about 65.56° C. for about five minutes and then rinsing with cold water. Ultrasonic cleaning then may be applied, followed by a further cold water rinse. To provide a surface finish which will promote adhesion of a photoresist material, sheet 10 then may be pretreated in a bath of hydrofluoric/nitric acid solution for about five minutes to etch sides 12 and 14, followed by a cold water rinse, a further bath in 20% nitric acid at 54.44° C. for about 10 minutes and a deionized water rinse. The sheets then may be dried in an oven 18 to remove moisture and preheat the sheet to a temperature suitable for lamination, such as 70° C.

Other treatments may be used to prepare the surfaces of sheet 10. For example, the sheet first may be acid etched to provide a fine finish on both sides. A protective layer then may be applied to one side of the sheet and the exposed side etched again to provide a more coarse finish. The more coarse finish will promote adhesion of covering layers to be applied later. The protective layer then may be removed. Or, the two sides of the sheet may be mechanically buffed, abraded, sand papered and the like, as appropriate to yield the desired finishes, to cause the covering layers to adhere more aggressively to one side and less aggressively to the other.

A lamination 20 is then made from sheet 10, a first sheet 22 of a first photoresist material and a second sheet 24 of a second, different photoresist material. By "different" photoresist material is meant that conventional solutions effective for stripping away the first photoresist material will have substantially no effect on the second photoresist material. Those skilled in the art will appreciate that a wide variety of photoresist materials may be used in accordance with the present invention. A suitable choice for the material of sheet 22 is Hercules AQUAMER MP-215 dry film photoresist, a photosensitive thermoplastic acrylic-based polymer, available from Hercules Incorporated of Wilmington, Del., U.S.A.. A suitable choice of the material of sheet 24 is DuPont VACREL dry film solder mask 8130, a copolymer system of methyl methacrylate and ethyl acrylate, available from DuPont Company of Wilmington, Del.

As shown in FIG. 2, photoresist sheet 22 typically comprises a photoresist layer 26 sandwiched between a cover layer 28 and a release sheet, not illustrated, which is removed just prior to lamination. Similarly, photoresist sheet 24 comprises a photoresist layer 30 sandwiched between a cover layer 32 and a release sheet, not illustrated, which also is removed prior to lamination. The three sheets are stacked and passed between hot laminating rolls 34, 36 in the conventional manner. For example, roller temperatures of about 70° C. and feed rates of about 1.0 m/min. have been found suitable. Excess photoresist may then be trimmed from the edges of the lamination. Finally, the lamination is passed between a further pair of hot laminating rolls, not illustrated, at about 130° C. to complete the lamination. While the use of dry film resists is preferred in accordance with the invention, those skilled in the art will appreciate that other coating techniques may be used to apply a wide variety of suitable materials, such as spraying, roller applying, dipping, spin coating and the like, without departing from the scope of the invention.

After cooling, the lamination is placed in a conventional ultraviolet exposure unit 38, where it is held under vacuum between a pair of registered masks 40, 42 which define patterns or slits in the shape of substantially congruent outlines 44, 46 of an article or part being made. Of course, conventional exposure units not requiring vacuum also may be used. The lamination is then exposed to radiation, such as ultraviolet light in the 300 to 400 nm range for the photoresists previously mentioned, from a pair of sources 48, 50. Exposure in the range of 9 to 11 steps on a Stouffer's step tablet typically is sufficient. After exposure, a period of about 10 minutes is allowed for crosslinking of the polymers in the photoresists to take place.

The exposed lamination is then passed through a conventional conveyorized spray developer 52. Of course, other types of developers could be used. For the specific photoresists described previously, a 0.75 to 1.0% solution of sodium carbonate having a temperature in the range of 24° to 27° C. is suitable as the developing solution. Preferably cover layer 32 is removed first and the lamination is passed through the developer with VACREL layer 30 facing upward. Then cover layer 28 is removed and the lamination is passed through with AQUAMER layer 26 facing upward. A third pass with layer 30 facing upward may be desirable. The lamination is then rinsed with hot tap water. As a result of this developing process, portions of the resist layers 26, 30 are removed to define, on opposite sides of the lamination, the congruent outlines of the article or part.

The developed lamination is then passed through a conventional conveyorized spray etcher 54. Other types of etchers also could be used. For the specific photoresists previously described, a ferric chloride solution having a Baume range of 39° to 42° is suitable, though other conventional etching solutions may be used without departing from our invention. Spray etcher 54 in the typical fashion has upper and lower sprayers, not illustrated, to direct etching solution at both sides of the part. The developed lamination is passed through etcher 54 with layer 26 facing upward. The rate of spraying etching solutions need not the same on both sides. After etching, the lamination is washed with hot water and the completed blanks 56 for the articles or parts may be separated from the lamination, cleaned and dried.

The blank is then chemically treated to remove layer 26. To strip layer 26 from each blank 56, a pan 58 is filled with a 50 g/l solution 60 of sodium hydroxide and held at about 27° to 37.8° C. Blank 56 is are placed in the bottom of the pan with layer 26 facing upward for about 0.5 to 1.0 minutes, or until layer 26 releases from metallic sheet 10, but without substantially effecting the material of layer 30. At this point the blanks may be removed from pan 58 and the material of layer 26 usually will simply slide off the surface of the article, or may be readily removed manually; while layer 30 remains firmly adhered to the other side of the blank to provide a layer of electrical insulation on only one side of the completed article. Those skilled in the art will appreciate from this description of the method of the invention that leaving blanks 56 in solution 60 for an extended time or raising too high the temperature of the solution may result in damage to layer 30. The blank is then rinsed with cold water, washed with a mild soap solution, rinsed again and dried. A final oven bake at about 100° C. completes the process.

While photoresist materials are preferred for layers 26 and 30, our invention also may be practiced by exposing and developing photoresist material on only one side of sheet 10. The other side may coated with a different photoresist material or any suitable material which can withstand the develop, etch and strip chemistries applied to the one side. The outline of the article may then be provided on the one side by exposing and developing in essentially the manner previously described and then etching through sheet 10 from only the photoresist side. One of layers 26 and 30 may then be stripped from the completed article. If the photoresist layer is stripped from the article, the article may then be removed from the other layer by stamping, cutting or the like.

PARTS LIST

10 ... metallic sheet
12 ... first, upper side of 10
14 ... second, lower side of 10
16 ... cleaning station
18 ... drying oven
20 ... lamination
22 ... first photoresist sheet
24 ... second photoresist sheet
26 ... photoresist layer
28 ... cover layer
30 ... photoresist layer
32 ... cover layer
34, 36 ... heated lamination rollers
38 ... ultraviolet exposure unit
40, 42 ... masks to define congruent outlines of article or part
44, 46 ... patterns or slits in 40, 42 to define congruent outlines of blank
48, 50 ... radiation sources, such as ultraviolet lamps
52 ... conveyorized spray developer unit
54 ... conveyorized spray etcher unit
56 ... article removed from lamination 18
58 ... pan for stripping solution
60 ... stripping solution in 58

While our invention has been shown and described with reference to particular embodiments thereof, those skilled in the art will understand that other variations in form and detail may be made without departing from the scope and spirit of our invention.

Having thus described our invention in sufficient detail to enable those skilled in the art to make and use it, we claim as new and desire to secure Letters Patent for:

1. A method for making an electrically insulated article, comprising steps of:
   providing a metallic sheet having a first side surface and a second side surface;
   cleaning the first and second side surfaces to remove foreign materials;
   applying a layer of a first photoresist material to the first side surface;
   applying a layer of a second, different photoresist material to the second side surface;
   exposing to radiation both of the layers of photoresist material via masks configured to define congruent outlines of the article in the two layers;
   after the exposing, developing the photoresist materials by removing portions of the layers to define the congruent outlines of the article;
   etching through the metallic sheet at the congruent outlines from both side surfaces to define a blank for the article; and
   chemically treating the blank for the article to remove the first photoresist material without substantially effecting the second photoresist material by placing the blank for the article in a pan with the first photoresist material facing upward; and soaking the blank in a lubrical solution and layers the first photoresist material to release from the blank; and
   after the soaking, removing the first photoresist material, thereby providing a finished blank with an electrically insulating layer on one side only.

2. A method according to claim 1, further comprising steps of:
   prior to applying the first photoresist material, treating the first side surface to adhere more aggressively to the first photoresist material; and
   prior to applying the second photoresist material, treating the second side surface to adhere less aggressively to the second photoresist material.

3. A method according to claim 2, wherein the first side is provided with a fine surface finish and the second side is provided with a more coarse surface finish.

4. A method according to claim 1, further comprising a step of:
   treating the first and second surfaces with acid to promote adhesion of a photoresist material.

5. A method according to claim 1, wherein the first and second photoresist materials are applied by laminating sheets of dry film photoresist material to the first and second sides.

6. A method according to claim 1, wherein the first and second photoresist materials are applied by coating liquid photoresist material to the first and second sides.

7. A method for making an electrically insulated article, comprising steps of:
   providing a metallic sheet having a first side surface and a second side surface;
   cleaning the first and second side surfaces to remove foreign materials;
   applying a layer of a photoresist material to the first side surface;
   applying a layer of a second, different material to the second side surface;
   exposing to radiation the layer of photoresist material via a mask configured to define an outline of the article;
   after the exposing, developing the photoresist material by removing portions of the layers to define the outline of the article;
   etching through the metallic sheet at the outline to define a blank for the article; and
   chemically treating the blank for the article to remove one of the first or second materials without substantially effecting the other material by placing the blank for the article in a pan with the first photoresist material facing upward: and soaking the blank in a lubrical solution and layers the first photoresist material to release from the blank; and
   after the soaking, removing the first photoresist material, thereby providing a finished blank with an electrically insulating layer on one side only.

8. A method according to claim 7, further comprising steps of:
   prior to applying the first photoresist material, treating the first side surface to adhere more aggressively to the first photoresist material;

prior to applying the second material, treating the second side surface to adhere less aggressively to the second material; and removing the first photoresist material to provide the blank.

9. A method according to claim 8, wherein the first side is provided with a fine surface finish and the second side is provided with a more coarse surface finish.

10. A method according to claim 7, further comprising a step of:

treating the first and second surfaces with acid to promote adhesion of a photoresist material.

11. A method according to claim 7, wherein the first photoresist material is applied by laminating a sheet of dry film photoresist material to the first side.

12. A method according to claim 7, wherein the first and second materials are applied by coating liquid photoresist material to the first and second sides.

* * * * *

UNITED STATES PATENT AND TRADEMARK OFFICE
CERTIFICATE OF CORRECTION

PATENT NO. : 5,714,079
DATED : February 3, 1998
INVENTOR(S) : Edwin A. Mycek, et. al.

It is certified that error appears in the above-identified patent and that said Letters Patent is hereby corrected as shown below:

Title page, item [60] should read --Provisional 60/000,680, filed June 12, 1995--.

Signed and Sealed this

Second Day of June, 1998

Attest:

BRUCE LEHMAN

Attesting Officer

Commissioner of Patents and Trademarks